United States Patent
Hosokura

(10) Patent No.: US 8,454,747 B2
(45) Date of Patent: Jun. 4, 2013

(54) METHOD FOR PRODUCING SINGLE-CRYSTAL THIN FILM

(75) Inventor: Tadasu Hosokura, Omihachiman (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 888 days.

(21) Appl. No.: 12/608,521

(22) Filed: Oct. 29, 2009

(65) Prior Publication Data

US 2010/0206215 A1 Aug. 19, 2010

(30) Foreign Application Priority Data

Feb. 18, 2009 (JP) ................................. 2009-034850

(51) Int. Cl.
*C30B 7/00* (2006.01)

(52) U.S. Cl.
USPC .................. 117/68; 117/54; 117/63; 117/73; 117/944; 117/949

(58) Field of Classification Search
USPC ............................ 117/54, 63, 68, 73, 944, 949
See application file for complete search history.

(56) References Cited

U.S. PATENT DOCUMENTS

| | | | | |
|---|---|---|---|---|
| 5,834,803 A | * | 11/1998 | Nashimoto | 257/295 |
| 2004/0224851 A1 | * | 11/2004 | Kakimoto et al. | 505/100 |
| 2006/0009362 A1 | * | 1/2006 | Hasegawa et al. | 505/100 |
| 2006/0214213 A1 | * | 9/2006 | Bariecki et al. | 257/310 |

FOREIGN PATENT DOCUMENTS

| | | |
|---|---|---|
| JP | 07-133188 A | 5/1995 |
| JP | 2007-180398 A | 7/2007 |
| JP | 2003-81694 | 3/2009 |

OTHER PUBLICATIONS

Paranthaman, S. et al., "Epitaxial Growth of BaZrO.sub.3 Films on Single Crystal Oxide Substrates Using Sol-Gel Alkoxide Precursors", Mater. Res. Bull., vol. 32, No. 12, 1997, pp. 1697-1704.*

* cited by examiner

*Primary Examiner* — Matthew Song
(74) *Attorney, Agent, or Firm* — Dickstein Shapiro LLP

(57) ABSTRACT

A method for producing a single-crystal thin film includes, for example, applying a chemical solution containing raw materials for a single-crystal thin film composed of $(Ba_xSr_yCa_z)TiO_3$ (wherein $x+y+z=1.0$) by spin coating on a thin film composed of $BaZrO_3$ formed on a MgO(100) surface of a MgO(100) substrate and subjecting the applied chemical solution to heat treatment at a temperature at which orientation occurs, thereby epitaxially growing a single-crystal thin film composed of $(Ba_xSr_yCa_z)TiO_3$.

20 Claims, 8 Drawing Sheets

METHOD FOR PRODUCING SINGLE-CRYSTAL THIN FILM

BACKGROUND OF THE INVENTION

1. Field of the Invention

The present invention relates to a method for producing a single-crystal thin film, and particularly, to a method for producing a single-crystal thin film composed of $(Ba_xSr_yCa_z)TiO_3$ (wherein x+y+z=1.0), such as barium strontium titanate (BST). Specifically, the present invention relates to a method for producing a single-crystal thin film such as a single-crystal dielectric thin film that can be used as, for example, a substrate for use in a sensor and a dielectric film for use in a capacitor, a single-crystal conductive thin film that can be used for a switch and a contact for use in a display and a touch panel and an electrode of a sensor, and a transparent single-crystal thin film that can be used for an electric field-application type of optical switch for use in a waveguide of an optical communication device.

2. Description of the Related Art

Hitherto, examples of a process for producing a single-crystal dielectric thin film include sputtering, MBE, pulsed laser deposition, and MOCVD. A satisfactory single-crystal dielectric thin film can be produced by the method for producing a single-crystal dielectric thin film of the related art. The single-crystal dielectric thin film usually has high performance.

Japanese Unexamined Patent Application Publication No. 7-133188 discloses a process for forming an epitaxially grown or highly oriented ferroelectric oxide thin film by applying an organometallic compound precursor solution on a single-crystal MgO or $MgAl_2O_4$ substrate and annealing the applied solution.

Japanese Unexamined Patent Application Publication No. 2007-180398 discloses a process for forming a BST-based high-dielectric film used for a capacitor such as a decoupling capacitor by, for example, applying a dielectric precursor solution containing titanium, barium, strontium, and lithium on a base to form a film.

However, since the processes for producing a single-crystal dielectric thin film of the related art employs sputtering, MBE, pulsed laser deposition, MOCVD, or the like, those processes requires complex conditions, facilities, and steps. It is thus difficult to produce a single-crystal dielectric thin film without increasing the production cost of the single-crystal dielectric thin film.

Furthermore, since the process for producing a single-crystal dielectric thin film of the related art employs sputtering, MBE, pulsed laser deposition, MOCVD, or the like, the raw materials for a single-crystal dielectric thin film produced are limited, leading to difficulty in adjusting the composition of the produced single-crystal dielectric thin film.

According to the process disclosed in Japanese Unexamined Patent Application Publication No. 7-133188, a Pb-based ferroelectric oxide thin film is formed, but the Publication does not describe a specific process for producing a high-performance barium strontium titanate (BST)-based single-crystal dielectric thin film. Similar to Japanese Unexamined Patent Application Publication No. 7-133188, there are many reports on oriented films of Pb-based complex oxides because of easy orientation of Pb-based complex oxides.

According to the process disclosed in Japanese Unexamined Patent Application Publication No. 2007-180398, a BST-based high-dielectric film is formed but a single-crystal or oriented high-dielectric film is not formed. Japanese Unexamined Patent Application Publication No. 2007-180398 does not describe a specific process for producing a high-performance BST-based single-crystal dielectric thin film.

Accordingly, Japanese Unexamined Patent Application Publication Nos. 7-133188 and 2007-180398 do not describe a specific process for producing a high-performance BST-based single-crystal dielectric thin film. Even if attention is focused on a combination of the processes disclosed in Japanese Unexamined Patent Application Publication Nos. 7-133188 and 2007-180398, it is difficult to produce a high-performance BST-based single-crystal dielectric thin film.

It is thus very difficult to easily produce a high-performance BST-based single-crystal dielectric thin film at low cost and to easily adjust the composition of a BST-based single-crystal dielectric thin film, on the basis of the process of the related art and the processes disclosed in Japanese Unexamined Patent Application Publication Nos. 7-133188 and 2007-180398.

SUMMARY OF THE INVENTION

Accordingly, it is one object of the present invention to provide a method for producing a single-crystal thin film, in which a single-crystal thin film such as a high-performance BST-based single-crystal dielectric thin film can be easily produced at low cost, and the composition of the single-crystal thin film such as a high-performance BST-based single-crystal dielectric thin film can be easily adjusted.

A method for producing a single-crystal thin film composed of $(Ba_xSr_yCa_z)TiO_3$ (wherein x+y+z=1.0) according to preferred embodiments of the present invention includes applying a chemical solution serving as a raw material for a single-crystal thin film composed of $(Ba_xSr_yCa_z)TiO_3$ (wherein x+y+z=1.0) by spin coating on a thin film composed of $Ba(Ti_aZr_{1-a})O_3$ (wherein $0 \leq a \leq 0.8$) formed on a MgO (100) surface of a substrate for use in single-crystal growth and subjecting the applied chemical solution to heat treatment at a temperature at which orientation occurs, thereby epitaxially growing a single-crystal thin film composed of $(Ba_xSr_yCa_z)TiO_3$.

In the method according to preferred embodiments of the present invention, the substrate for use in single-crystal growth is preferably a MgO(100) substrate.

In the method according to preferred embodiments of the present invention, the thin film composed of $Ba(Ti_aZr_{1-a})O_3$ is preferably a single-crystal thin film oriented in the [100] direction.

In the method according to preferred embodiments of the present invention, the chemical solution may be doped with a pentavalent metal element such as Nb or a hexavalent metal element such as W.

In the method according to preferred embodiments of the present invention, the chemical solution preferably contains an organic solvent, a titanium alkoxide or a titanium carboxylate, and at least one compound selected from a barium alkoxide or a barium carboxylate, a strontium alkoxide or a strontium carboxylate, and a calcium alkoxide or a calcium carboxylate.

In the method according to preferred embodiments of the present invention, applying the chemical solution by spin coating and then subjecting the applied chemical solution to the heat treatment are preferably repeated one or more times.

In the method for producing a single-crystal thin film according to preferred embodiments of the present invention, the chemical solution serving as a raw material for a single-crystal thin film composed of $(Ba_xSr_yCa_z)TiO_3$ (wherein x+y+z=1.0) is applied by spin coating on the thin film composed of $Ba(Ti_aZr_{1-a})O_3$ (wherein $0 \leq a \leq 0.8$) formed on the MgO(100) surface of the substrate for use in single-crystal growth. Then the applied chemical solution is subjected to heat treatment at a temperature at which orientation occurs, thereby epitaxially growing the single-crystal thin film composed of $(Ba_xSr_yCa_z)TiO_3$.

In the method for producing a single-crystal thin film according to preferred embodiments of the present invention, unlike the process for producing a single-crystal dielectric thin film of the related art, sputtering, MBE, pulsed laser deposition, MOCVD, or the like, is not employed. The chemical solution serving as a raw material for a single-crystal thin film composed of $(Ba_xSr_yCa_z)TiO_3$ is applied by spin coating on the thin film composed of $Ba(Ti_aZr_{1-a})O_3$ formed on the MgO(100) surface of the substrate for use in single-crystal growth. Then the applied chemical solution is subjected to heat treatment, thereby epitaxially growing the single-crystal thin film composed of $(Ba_xSr_yCa_z)TiO_3$. Thus, a single-crystal thin film such as a high-performance BST-based single-crystal dielectric thin film is easily produced at low cost.

In the method for producing a single-crystal thin film according to preferred embodiments of the present invention, the composition of the single-crystal thin film such as a BST-based single-crystal dielectric thin film can be adjusted by adjusting the composition of the chemical solution serving as a raw material for a single-crystal thin film of $(Ba_xSr_yCa_z)TiO_3$. Thus, the composition of the single-crystal thin film such as a BST-based single-crystal dielectric thin film can be easily adjusted.

In the method for producing a single-crystal thin film according to preferred embodiments of the present invention, the MgO(100) substrate is used as a substrate for use in single-crystal growth. Thus, a satisfactory single-crystal thin film such as a BST-based single-crystal dielectric thin film can be produced on the thin film of $Ba(Ti_aZr_{1-a})O_3$ formed on the MgO(100) surface of the MgO(100) substrate.

In the method for producing a single-crystal thin film according to preferred embodiments of the present invention, the single-crystal thin film oriented in the [100] direction is used as the thin film of $Ba(Ti_aZr_{1-a})O_3$, thus producing a satisfactory single-crystal thin film such as a BST-based single-crystal dielectric thin film.

In the case where a single-crystal thin film produced by the method for producing a single-crystal thin film according to preferred embodiments of the present invention is a single-crystal dielectric thin film, the single-crystal dielectric thin film can be used as, for example, a substrate for use in a sensor and a dielectric film for use in a capacitor. A transparent single-crystal dielectric thin film can also be used for, for example, an electric field-application type of optical switch for use in a waveguide of an optical communication device.

In the method for producing a single-crystal thin film according to preferred embodiments of the present invention, in the case where a chemical solution doped with, for example, Nb or W, is used as the chemical solution, it is possible to produce a single-crystal conductive thin film that can be used for a switch and a contact for use in a display and a touch panel and an electrode of a sensor. If the single-crystal thin film is transparent, the transparent film can also be used for, for example, an electric field-application type of optical switch for use in a waveguide of an optical communication device.

In the method for producing a single-crystal thin film according to preferred embodiments of the present invention, the chemical solution contains an organic solvent, a titanium alkoxide or a titanium carboxylate, and at least one compound selected from a barium alkoxide or a barium carboxylate, a strontium alkoxide or a strontium carboxylate, and a calcium alkoxide or a calcium carboxylate. The composition of the resulting single-crystal thin film such as a BST-based single-crystal dielectric thin film, i.e., proportions of barium, strontium, and calcium, can thus be easily adjusted by changing the composition of the chemical solution.

In the method for producing a single-crystal thin film according to preferred embodiments of the present invention, the thickness of the resulting single-crystal thin film such as a BST-based single-crystal dielectric thin film can be adjusted by changing the number of repetitions of a procedure including the spin coating and the heat treatment of the chemical solution.

The foregoing will become more apparent from the following detailed description of preferred embodiments of the present invention with reference to the attached drawings.

DESCRIPTION OF THE PREFERRED EMBODIMENTS

Figure 1:
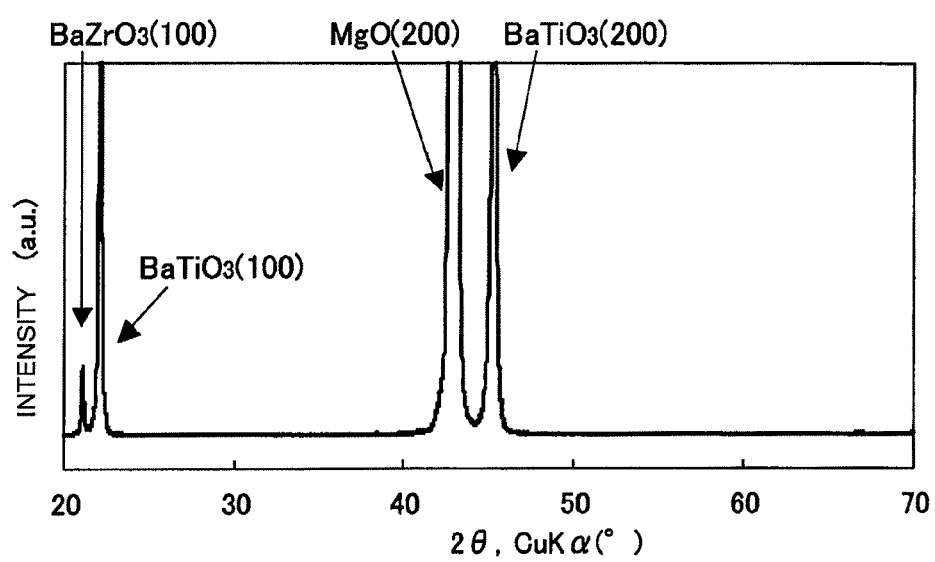
FIG. 1 is an X-ray diffraction spectrum of a sample produced in Example 1.

In a preferred embodiment, a MgO(100) substrate is prepared as a substrate having a MgO(100) surface used for single-crystal growth.

A chemical solution serving as a raw material for a thin film composed of a compound represented by the formula $Ba(Ti_aZr_{1-a})O_3$ (wherein $0 \leq a \leq 0.8$, preferably $0 \leq a \leq 0.7$), for example, $BaZrO_3$, is prepared. The chemical solution serving as a raw material for a thin film can be prepared by, for example, mixing a barium alkoxide or a barium carboxylate, a zirconium alkoxide or zirconium carboxylate, and, as needed, a titanium alkoxide or a titanium carboxylate in an organic solvent.

Furthermore, a chemical solution serving as a raw material for a single-crystal thin film composed of a compound represented by the formula $(Ba_xSr_yCa_z)TiO_3$ (wherein x+y+z=1.0), for example, $BaTiO_3$ or $SrTiO_3$, is prepared. The chemical solution serving as a raw material for the single-crystal thin film can be prepared by mixing a titanium alkoxide or a titanium carboxylate and at least one compound selected from a barium alkoxide or a barium carboxylate, a strontium alkoxide or a strontium carboxylate, and calcium alkoxide or calcium carboxylate, in an organic solvent.

The resulting chemical solution serving as a raw material for a thin film composed of $BaZrO_3$ is applied by spin coating on the MgO(100) surface of the MgO(100) substrate. The applied chemical solution is heated to, for example, about 800° C. at a heating rate of about 300 K/minute, maintained for about 20 minutes at the temperature, and then cooled at a cooling rate of, for example, about 100 K/minute.

This procedure including the spin coating and the heat treatment of the chemical solution serving as a raw material for the thin film composed of $BaZrO_3$ is repeated, for example, about six times, thereby forming a thin film composed of $BaZrO_3$ on the MgO(100) surface of the MgO(100) substrate by epitaxial growth. Other times and temperatures can be used.

Then the chemical solution serving as a raw material for a single-crystal thin film composed of $BaTiO_3$ or $SrTiO_3$ is applied by spin coating on the thin film of $BaZrO_3$ formed on the MgO(100) surface of the MgO(100) substrate. The applied chemical solution is heated to, for example, about 800° C. at a heating rate of about 300 K/minute, maintained for about 20 minutes at the temperature, and then cooled at a cooling rate of, for example, about 100 K/minute. Other times and temperatures can be used.

This procedure including the spin coating and the heat treatment of the chemical solution serving as a raw material for a single-crystal thin film composed of $BaTiO_3$ or $SrTiO_3$ is repeated, for example, about six times, thereby forming a single-crystal thin film composed of $BaTiO_3$ or $SrTiO_3$ by epitaxial growth on the thin film of $BaZrO_3$ formed on the MgO(100) surface of the MgO(100) substrate.

In the method for producing a single-crystal thin film, the chemical solution serving as a raw material for a single-crystal thin film composed of $BaTiO_3$ or $SrTiO_3$ is applied by spin coating on the thin film of $BaZrO_3$ on the MgO(100) surface of the MgO(100) substrate. The applied chemical solution is subjected to the heat treatment, thereby epitaxially growing the single-crystal thin film composed of $BaTiO_3$ or $SrTiO_3$. Thus, the single-crystal thin film such as a high-performance BST-based single-crystal dielectric thin film is easily produced, leading to low cost.

In the method for producing a single-crystal thin film, furthermore, the composition of the single-crystal thin film such as a BST-based single-crystal dielectric thin film can be adjusted by adjusting the composition of the chemical solution serving as a raw material for a single-crystal thin film. Thus, the composition of the single-crystal thin film such as a BST-based single-crystal dielectric thin film can be easily adjusted.

In the method for producing a single-crystal thin film, the MgO(100) substrate is used as a substrate for use in single-crystal growth. Thus, a satisfactory single-crystal thin film such as a BST-based single-crystal dielectric thin film can be produced on the thin film of $BaZrO_3$ formed on the MgO(100) surface of the MgO(100) substrate.

In the method for producing a single-crystal thin film, a thin film of $BaZrO_3$, i.e., the single-crystal thin film oriented in the [100] direction, is used. Thus, a satisfactory single-crystal thin film such as a BST-based single-crystal dielectric thin film can be produced.

In the case where a single-crystal thin film produced by the method for producing a single-crystal thin film is a single-crystal dielectric thin film, the single-crystal dielectric thin film can be used as, for example, a substrate for use in a sensor and a dielectric film for use in a capacitor. In particular, a transparent single-crystal dielectric thin film can also be used for, for example, an electric field-application type of optical switch for use in a waveguide of an optical communication device. The MgO(100) substrate and the thin film of $BaZrO_3$ are also transparent; hence, the whole of the transparent single-crystal dielectric thin film integral with the MgO(100) substrate and the thin film of $BaZrO_3$ can be used as a transparent element. Furthermore, the single-crystal dielectric thin film need not have an underlying conductive thin film such as a Pt(100) thin film. Thus, in the case where the single-crystal dielectric thin film is used as, for example, a substrate on which an electrode such as a substantially comb-shaped electrode is formed, the electrode has little risk of a short circuit due to the conductive thin film.

According to the method for producing a single-crystal thin film, in the case where a chemical solution doped with, for example, Nb or W, is used as the chemical solution serving as a raw material for a single-crystal thin film, it is possible to produce a single-crystal conductive thin film that can be used for a switch and a contact for use in a display and a touch panel and an electrode of a sensor. Furthermore, in the case where a chemical solution doped with a lanthanoid metal element such as Eu or Ce is used, it is possible to produce a luminous single-crystal thin film for use in a luminous element. In these cases, if the resulting single-crystal thin films are transparent, each of the transparent films can also be used for, for example, an electric field-application type of optical switch for use in a waveguide of an optical communication device. The whole of each transparent film integral with the MgO(100) substrate and the thin film of $BaZrO_3$ can be used as a transparent element. Note that the use of the conductive single-crystal thin film as an electrode of a sensor increases the flexibility of design of the sensor.

In the method for producing a single-crystal thin film, the chemical solution serving as a raw material for a single-crystal thin film contains an organic solvent, a titanium alkoxide or a titanium carboxylate, and at least one compound selected from a barium alkoxide or a barium carboxylate, a strontium alkoxide or a strontium carboxylate, and a calcium alkoxide or a calcium carboxylate. The composition of the resulting single-crystal thin film such as a BST-based single-crystal dielectric thin film, i.e., proportions of barium, strontium, and calcium, can thus be easily adjusted by changing the composition of the chemical solution serving as a raw material for the single-crystal thin film.

In the method for producing a single-crystal thin film, the thickness of the resulting single-crystal thin film such as a BST-based single-crystal dielectric thin film can be adjusted by changing the number of repetitions of a procedure including the spin coating and the heat treatment of the chemical solution serving as a raw material for the single-crystal thin film.

In the method for producing a single-crystal thin film, the chemical solution serving as raw material for a thin film composed of $Ba(Ti_aZr_{1-a})O_3$ contains an organic solvent, a barium alkoxide or a barium carboxylate, a zirconium alkoxide or zirconium carboxylate, and, as needed, a titanium alkoxide or a titanium carboxylate. The composition of the resulting thin film of $Ba(Ti_aZr_{1-a})O_3$, i.e., proportions of titanium and zirconium, can thus be easily adjusted by changing the composition of the chemical solution serving as a raw material for the thin film of $Ba(Ti_aZr_{1-a})O_3$.

In the method for producing a single-crystal thin film, the thickness of the resulting thin film of $Ba(Ti_aZr_{1-a})O_3$ can be adjusted by changing the number of repetitions a procedure including the application and the heat treatment of the chemical solution serving as a raw material for the thin film of $Ba(Ti_aZr_{1-a})O_3$.

EXAMPLE 1

A MgO(100) substrate was prepared as a substrate used for single-crystal growth.

A chemical solution serving as a raw material for a thin film of $BaZrO_3$ was prepared under preparation conditions described below in such a manner that the thin film had a molar ratio of Ba to Zr of 1.0:1.0.

Preparation Conditions of Solution

| Raw material | |
|---|---|
| Barium acetate | 1.146 g |
| Zirconium isopropoxide | 1.478 g |
| Solvent | |
| Acetic acid | 3 mL |
| 2-Methoxyethanol | 7 mL |

A chemical solution serving as a raw material for a single-crystal dielectric thin film of $BaTiO_3$ was prepared under preparation conditions described below in such a manner that the thin film had a molar ratio of Ba to Ti of 1.0:1.0.

Preparation Conditions of Solution

| Raw material | |
|---|---|
| Barium acetate | 1.146 g |
| Titanium isopropoxide | 1.278 g |
| Solvent | |
| Acetic acid | 3 mL |
| 2-Methoxyethanol | 7 mL |

The resulting chemical solution serving as a raw material for a thin film of $BaZrO_3$ was applied by spin coating on a MgO(100) surface of the MgO(100) substrate. In this case, the chemical solution was placed on the MgO(100) surface of the MgO(100) substrate and rotated together with the MgO (100) substrate at 600 rpm for 3 seconds and then at 4000 rpm for 30 seconds so as to be in the form of a thin film. The thin-film shaped chemical solution was dried on a hot plate at 150° C. for 5 minutes.

The applied chemical solution by spin coating was then subjected to heat treatment under conditions described below.

Conditions of Heat Treatment

The applied chemical solution by spin coating was heated from room temperature to 800° C. at a heating rate of 300 K/minute under a stream of oxygen at a flow rate of 200 mL/minute and maintained at the temperature for 20 minutes.

The heated chemical solution was cooled to room temperature at a cooling rate of 100 K/minute.

A procedure including the spin coating and the heat treatment of the chemical solution was repeated six times to form a thin film of $BaZrO_3$ on the MgO(100) surface of the MgO(100) substrate. Note that for the second and subsequent repetitions of the procedure including the spin coating and the heat treatment of the chemical solution, another thin film component of $BaZrO_3$ is formed on the preceding thin film component of $BaZrO_3$.

Then the chemical solution serving as a raw material for a single-crystal dielectric thin film of $BaTiO_3$ was applied by spin coating on the thin film of $BaZrO_3$ formed on the MgO (100) surface of the MgO(100) substrate. In this case, the chemical solution was placed on the thin film of $BaZrO_3$ formed on the MgO(100) substrate and rotated together with the MgO(100) substrate at 600 rpm for 3 seconds and then at 4000 rpm for 30 seconds so as to be in the form of a thin film. The thin-film shaped chemical solution was dried on a hot plate at 150° C. for 5 minutes.

The chemical solution, serving as a raw material for a single-crystal dielectric thin film of $BaTiO_3$, applied by spin coating was then subjected to heat treatment under conditions described below.

Conditions of Heat Treatment

The chemical solution applied by spin coating was heated from room temperature to 800° C. at a heating rate of 300 K/minute under a stream of oxygen at a flow rate of 200 mL/minute and maintained at the temperature for 20 minutes.

The heated chemical solution was cooled to room temperature at a cooling rate of 100 K/minute.

A procedure including the spin coating and the heat treatment of the chemical solution was also repeated six times to form a single-crystal dielectric thin film of $BaTiO_3$ on the thin film of $BaZrO_3$ formed on the MgO(100) substrate. Note that for the second and subsequent repetitions of the procedure including the spin coating and the heat treatment of the chemical solution, another single-crystal dielectric thin film component of $BaTiO_3$ is formed on the preceding single-crystal dielectric thin film component of $BaTiO_3$.

In this way, a sample was produced in Example 1, the sample including the single-crystal dielectric thin film of $BaTiO_3$ on the thin film of $BaZrO_3$ arranged on the MgO(100) surface of the MgO(100) substrate.

FIG. 1 is an X-ray diffraction spectrum of the sample produced in Example 1. In the X-ray diffraction spectrum of the sample produced in Example 1 as shown in FIG. 1, the (100) and (200) peaks of $BaTiO_3$, the (100) peak of $BaZrO_3$, and the (200) peak of MgO were observed. In an X-ray diffraction spectrum of each of $BaTiO_3$ and $BaZrO_3$, the (110) peak was usually strongest. In this measurement, the (110) peak was not observed. Only the (100) and (200) peaks were observed, which indicated the (100) orientation. This indicated that the resulting single-crystal thin film of $BaZrO_3$ was strongly oriented in the [100] direction and that the resulting single-crystal dielectric thin film of $BaTiO_3$ formed thereon was also oriented in the [100] direction. The reason for this may be as follows: MgO has a lattice constant of 0.42112 nm. $BaZrO_3$ has a lattice constant of 0.4192 nm. The difference in lattice constant between MgO and $BaZrO_3$ was small enough to allow oriented growth to occur. Thus, the thin film of $BaZrO_3$ oriented in the [100] direction was formed on the MgO(100) substrate. Furthermore, the thin film of $BaZrO_3$ having the same crystal structure as $BaTiO_3$ and being oriented in the [100] direction was formed as a buffer. It was therefore possible to form the single-crystal dielectric thin film of $BaTiO_3$ oriented in the [100] direction. In the X-ray diffraction spectrum shown in FIG. 1, the MgO(200) peak indicates that the MgO(100) substrate is oriented in the [100] direction.

Figure 2:
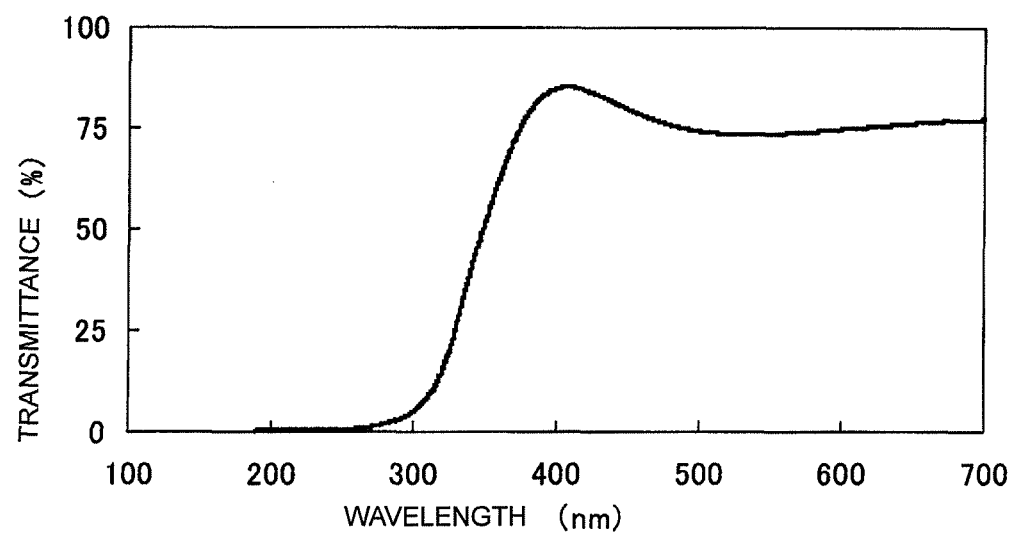
FIG. 2 is a transmission spectrum of the sample produced in Example 1.

FIG. 2 is a transmission spectrum of the sample produced in Example 1. The transmission spectrum shown in FIG. 2 demonstrated that the sample produced in Example 1 was transparent in the visible range of 400 nm to 700 nm. Thus, the sample produced in Example 1 was transparent.

Figure 3:
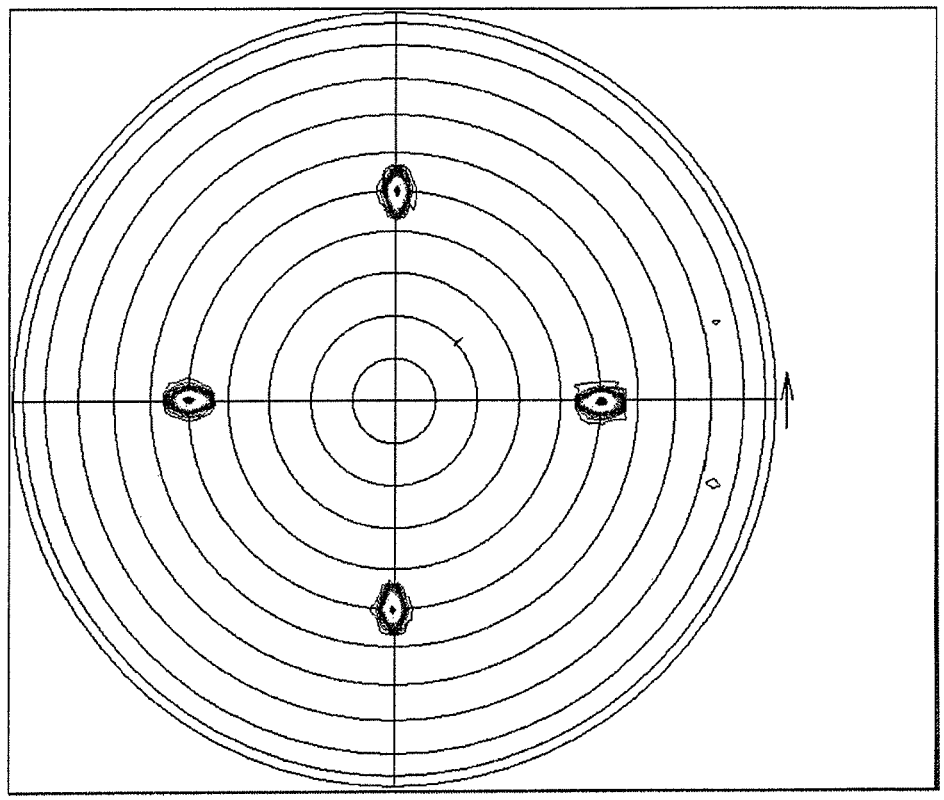
FIG. 3 is a pole figure of the sample, MgO(100)/$BaZrO_3$ (100)/$BaTiO_3$ (100), produced in Example 1.

FIG. 3 is a pole figure of the sample, MgO(100)/$BaZrO_3$ (100)/$BaTiO_3$ (100), produced in Example 1. From the pole figure shown in FIG. 3, only a four-fold symmetric pattern was detected at a φ value of about 45°. The results demonstrated that the sample of the single-crystal dielectric thin film of $BaTiO_3$ produced in Example 1 was a triaxially oriented film in which the <100> direction was the direction normal to a surface of the sample.

In Example 1, therefore, the same advantages as in the foregoing embodiment were provided.

COMPARATIVE EXAMPLE

A MgO(100) substrate was prepared as a substrate used for single-crystal growth as in Example 1.

A chemical solution serving as a raw material for a dielectric thin film of $BaTiO_3$ was prepared under preparation conditions described below in such a manner that the thin film had a molar ratio of Ba to Ti of 1.0:1.0, as in Example 1.
Preparation Conditions of Solution

| Raw material | |
|---|---|
| Barium acetate | 1.146 g |
| Titanium isopropoxide | 1.278 g |
| Solvent | |
| Acetic acid | 3 mL |
| 2-Methoxyethanol | 7 mL |

In Comparative Example, the chemical solution serving as a raw material for a dielectric thin film of $BaTiO_3$ was applied by spin coating on a MgO(100) surface of the MgO(100) substrate.

The conditions of the spin coating in Comparative Example were the same as the conditions of the spin coating in Example 1. That is, the chemical solution was placed on the MgO (100) surface of the MgO (100) substrate and rotated together with the MgO(100) substrate at 600 rpm for 3 seconds and then at 4000 rpm for 30 seconds so as to be in the form of a thin film. The thin-film shaped chemical solution was dried on a hot plate at 150° C. for 5 minutes.

The chemical solution, serving as a raw material for the dielectric thin film of $BaTiO_3$, applied by spin coating was then subjected to heat treatment.

The conditions of the heat treatment in Comparative Example were the same as in the conditions of the heat treatment in Example 1. That is, the chemical solution applied by spin coating was heated from room temperature to 800° C. at a heating rate of 300 K/minute under a stream of oxygen at a flow rate of 200 mL/minute and maintained at the temperature for 20 minutes. The heated chemical solution was cooled to room temperature at a cooling rate of 100 K/minute.

A procedure including the spin coating and the heat treatment of the chemical solution was repeated six times to form a dielectric thin film of $BaTiO_3$ on the MgO surface of the MgO(100) substrate.

In this way, a sample was produced in Comparative Example, the sample including the dielectric thin film of $BaTiO_3$ on the MgO(100) surface of the MgO(100) substrate.

Figure 4:
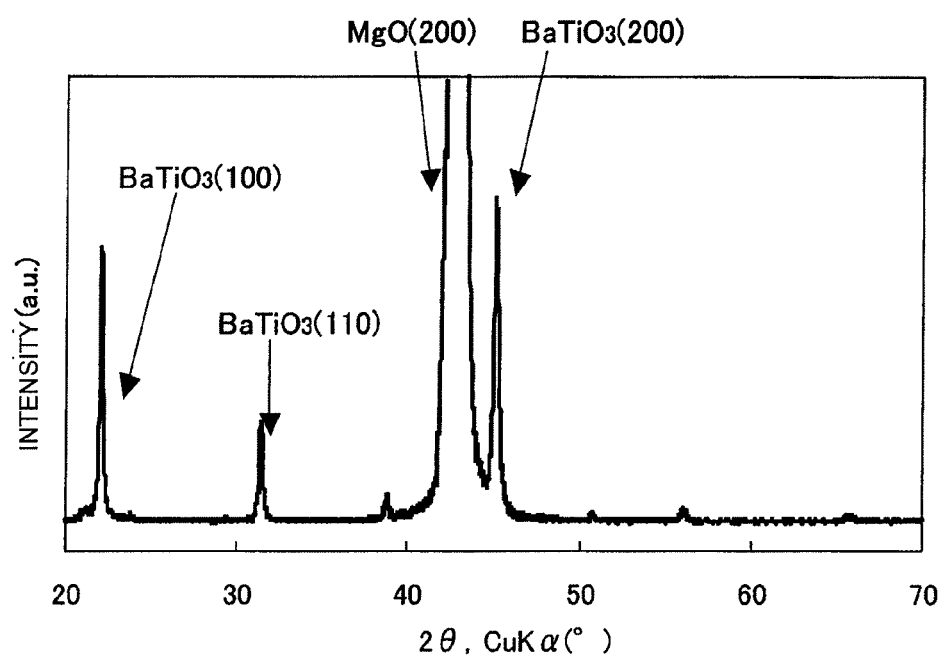
FIG. 4 is an X-ray diffraction spectrum of a sample produced in Comparative Example.

FIG. 4 is an X-ray diffraction spectrum of the sample produced in the Comparative Example. In this X-ray diffraction spectrum, the (100), (110), and (200) peaks of $BaTiO_3$ are observed. The fact that the (110) peak was also observed demonstrated that orientation did not occur in a specific direction, i.e., the thin film did not have specific orientation in the dielectric thin film of $BaTiO_3$ formed in Comparative Example. The reason for this may be as follows: MgO has a lattice constant of 0.42112 nm. $BaTiO_3$ has a lattice constant of 0.3989 nm. The difference in lattice constant between MgO and $BaTiO_3$ was too large to allow oriented growth to occur. Thus, a dielectric thin film of $BaTiO_3$ oriented in the [100] direction was not formed on the MgO(100) substrate.

In Example 1, therefore, there were advantages that the single-crystal dielectric thin film of $BaTiO_3$ oriented in the [100] direction was formed, as compared with Comparative Example.

EXAMPLE 2

A MgO(100) substrate was prepared as a substrate used for single-crystal growth as in Example 1.

A chemical solution serving as a raw material for a thin film of $BaZrO_3$ was prepared under preparation conditions described below in such a manner that the thin film had a molar ratio of Ba to Zr of 1.0:1.0, as in Example 1.
Preparation Conditions of Solution

| Raw material | |
|---|---|
| Barium acetate | 1.146 g |
| Zirconium isopropoxide | 1.478 g |
| Solvent | |
| Acetic acid | 3 mL |
| 2-Methoxyethanol | 7 mL |

In Example 2, furthermore, a chemical solution serving as a raw material for a single-crystal dielectric thin film of $SrTiO_3$ was prepared under preparation conditions described below in such a manner that the thin film had a molar ratio of Sr to Ti of 1.0:1.0.
Preparation Conditions of Solution

| Raw material | |
|---|---|
| Strontium acetate | 0.963 g |
| Titanium isopropoxide | 1.278 g |
| Solvent | |
| Acetic acid | 3 mL |
| 2-Methoxyethanol | 7 mL |

The resulting chemical solution serving as a raw material for a thin film of $BaZrO_3$ was applied by spin coating on a MgO(100) surface of the MgO(100) substrate as in Example 1. That is, the chemical solution was placed on the MgO(100) surface of the MgO(100) substrate and rotated together with the MgO(100) substrate at 600 rpm for 3 seconds and then at 4000 rpm for 30 seconds so as to be in the form of a thin film. The thin-film shaped chemical solution was dried on a hot plate at 150° C. for 5 minutes.

The applied chemical solution by spin coating was then subjected to heat treatment under conditions described below, as in Example 1.
Conditions of Heat Treatment The chemical solution applied by spin coating was heated from room temperature to 800° C. at a heating rate of 300 K/minute under a stream of oxygen at a flow rate of 200 mL/minute and maintained at the temperature for 20 minutes.

The heated chemical solution was cooled to room temperature at a cooling rate of 100 K/minute.

The procedure including the spin coating and the heat treatment of the chemical solution was repeated six times as in Example 1 to form a thin film of $BaZrO_3$ on the MgO(100) surface of the MgO(100) substrate.

Then, the chemical solution serving as a raw material for a single-crystal dielectric thin film of $SrTiO_3$ was applied by spin coating on the thin film of $BaZrO_3$ formed on the MgO (100) surface of the MgO(100) substrate. In this case, the chemical solution was placed on the thin film of $BaZrO_3$ formed on the MgO(100) substrate and rotated together with the MgO(100) substrate at 600 rpm for 3 seconds and then at 4000 rpm for 30 seconds so as to be in the form of a thin film. The thin-film shaped chemical solution was dried on a hot plate at 150° C. for 5 minutes.

The chemical solution, serving as a raw material for a single-crystal dielectric thin film of $SrTiO_3$, applied by spin coating was then subjected to heat treatment under conditions described below.

Conditions of Heat Treatment

The chemical solution applied by spin coating was heated from room temperature to 800° C. at a heating rate of 300 K/minute under a stream of oxygen at a flow rate of 200 mL/minute and maintained at the temperature for 20 minutes.

The heated chemical solution was cooled to room temperature at a cooling rate of 100 K/minute.

The procedure including the spin coating and the heat treatment of the chemical solution was also repeated six times to form a single-crystal dielectric thin film of $SrTiO_3$ on the thin film of $BaZrO_3$ formed on the MgO(100) surface of the MgO(100) substrate. Note that for the second and subsequent repetitions of the procedure including the spin coating and the heat treatment of the chemical solution, another single-crystal dielectric thin film component of $SrTiO_3$ is formed on the preceding single-crystal dielectric thin film component of $SrTiO_3$.

In this way, a sample was produced in Example 2, the sample including the single-crystal dielectric thin film of $SrTiO_3$ on the thin film of $BaZrO_3$ arranged on the MgO(100) surface of the MgO(100) substrate.

Figure 5:
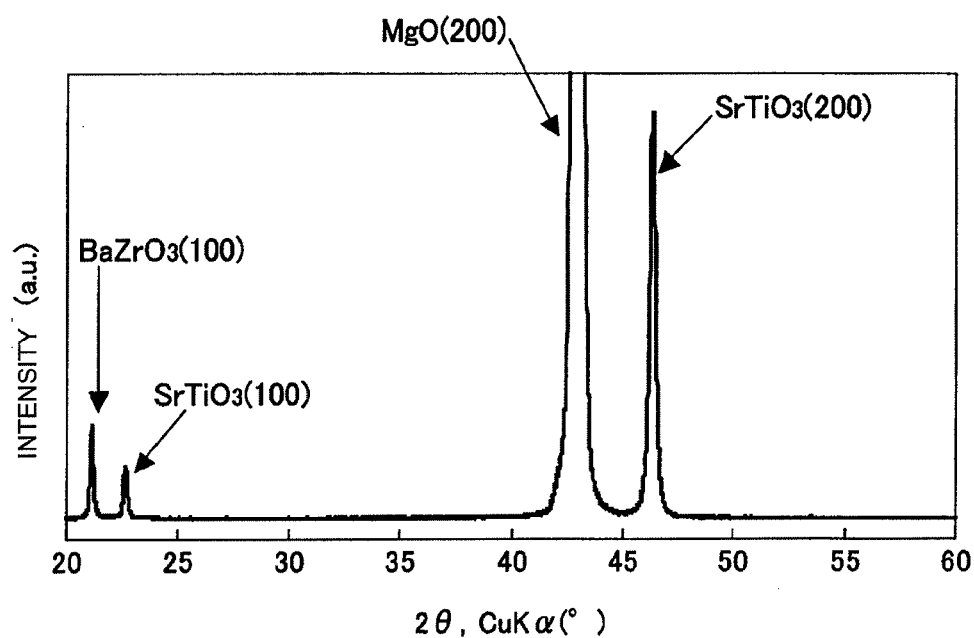
FIG. 5 is an X-ray diffraction spectrum of a sample produced in Example 2.

FIG. 5 is an X-ray diffraction spectrum of the sample produced in Example 2. In the X-ray diffraction spectrum of the sample produced in Example 2 as shown in FIG. 5, the (100) and (200) peaks of $SrTiO_3$, the (100) peak of $BaZrO_3$, and the (200) peak of MgO were observed. In an X-ray diffraction spectrum of each of $SrTiO_3$ and $BaZrO_3$, the (110) peak was usually strongest. In this measurement, the (110) peak was not observed. Only the (100) and (200) peaks were observed, which indicated the (100) orientation. This indicated that the resulting single-crystal thin film of $BaZrO_3$ was strongly oriented in the [100] direction and that the resulting single-crystal dielectric thin film of $SrTiO_3$ formed thereon was also oriented in the [100] direction. The reason for this may be as follows: MgO has a lattice constant of 0.42112 nm. $BaZrO_3$ has a lattice constant of 0.4192 nm. The difference in lattice constant between MgO and $BaZrO_3$ was small enough to allow oriented growth to occur. Thus, the thin film of $BaZrO_3$ oriented in the [100] direction was formed on the MgO(100) substrate. Furthermore, the thin film of $BaZrO_3$ having the same crystal structure as $SrTiO_3$ and being oriented in the [100] direction was formed as a buffer. It was therefore possible to form the single-crystal dielectric thin film of $SrTiO_3$ oriented in the [100] direction. In the X-ray diffraction spectrum shown in FIG. 5, the MgO(200) peak indicates that the MgO(100) substrate is oriented in the [100] direction.

Figure 6:
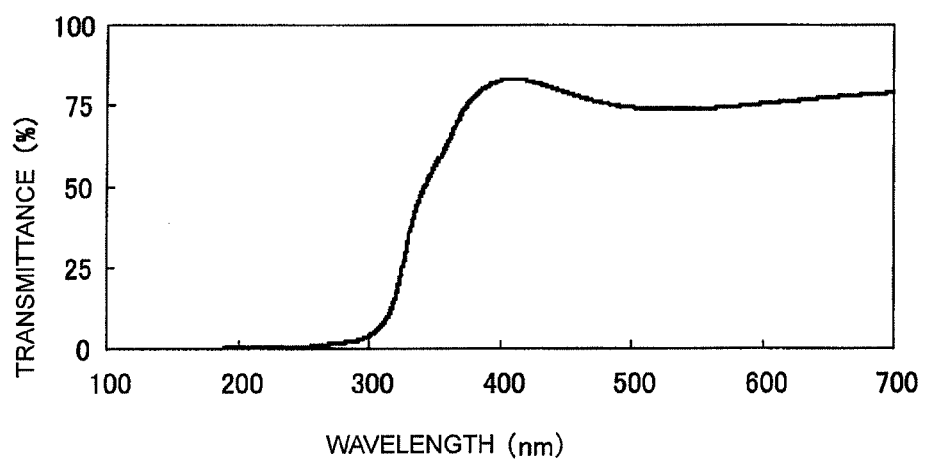
FIG. 6 is a transmission spectrum of the sample produced in Example 2.

FIG. 6 is a transmission spectrum of the sample produced in Example 2. The transmission spectrum demonstrates that the sample produced in Example 2 was transparent in the visible range of 400 nm to 700 nm. Thus, the sample produced in Example 2 was transparent.

Also in Example 2, therefore, the same advantages as in Example 1 were provided.

EXAMPLE 3

A MgO(100) substrate was prepared as a substrate used for single-crystal growth as in Example 1.

A chemical solution serving as a raw material for a thin film of $BaZrO_3$ was prepared under preparation conditions described below in such a manner that the thin film had a molar ratio of Ba to Zr of 1.0:1.0, as in Example 1.

Preparation Conditions of Solution

| Raw material | |
| --- | --- |
| Barium acetate | 1.146 g |
| Zirconium isopropoxide | 1.478 g |
| Solvent | |
| Acetic acid | 3 mL |
| 2-Methoxyethanol | 7 mL |

In Example 3, furthermore, a chemical solution serving as a raw material for a single-crystal conductive thin film of Nb-doped $SrTiO_3$ was prepared under preparation conditions described below in such a manner that the thin film had a molar ratio of Sr to Ti to Nb of 1.0:1.0:0.1.

Preparation Conditions of Solution

| Raw material | |
| --- | --- |
| Strontium acetate | 0.963 g |
| Titanium isopropoxide | 1.278 g |
| Niobium chloride | 0.012 g |
| Solvent | |
| Acetic acid | 3 mL |
| 2-Methoxyethanol | 7 mL |

The resulting chemical solution serving as a raw material for a thin film of $BaZrO_3$ was applied by spin coating on a MgO(100) surface of the MgO(100) substrate as in Example 1. That is, the chemical solution was placed on the MgO (100) surface of the MgO (100) substrate and rotated together with the MgO(100) substrate at 600 rpm for 3 seconds and then at 4000 rpm for 30 seconds so as to be in the form of a thin film. The thin-film shaped chemical solution was dried on a hot plate at 150° C. for 5 minutes.

The applied chemical solution by spin coating was then subjected to heat treatment under conditions described below, as in Example 1.

Conditions of Heat Treatment

The chemical solution applied by spin coating was heated from room temperature to 800° C. at a heating rate of 300 K/minute under a stream of oxygen at a flow rate of 200 mL/minute and maintained at the temperature for 20 minutes.

The heated chemical solution was cooled to room temperature at a cooling rate of 100 K/minute.

The procedure including the spin coating and the heat treatment of the chemical solution was repeated six times as in Example 1 to form a thin film of $BaZrO_3$ on the MgO(100) surface of the MgO(100) substrate.

Then, in Example 3, the chemical solution serving as a raw material for a single-crystal conductive thin film of Nb-doped $SrTiO_3$ was applied by spin coating on the thin film of $BaZrO_3$ formed on the MgO(100) surface of the MgO(100) substrate. In this case, the chemical solution was placed on the thin film of $BaZrO_3$ formed on the MgO(100) substrate and rotated together with the MgO(100) substrate at 600 rpm for 3 seconds and then at 4000 rpm for 30 seconds so as to be in the form of a thin film. The thin-film shaped chemical solution was dried on a hot plate at 150° C. for 5 minutes.

The chemical solution, serving as a raw material for a single-crystal conductive thin film of Nb-doped $SrTiO_3$, applied by spin coating was then subjected to heat treatment under conditions described below.

Conditions of Heat Treatment

The chemical solution applied by spin coating was heated from room temperature to 800° C. at a heating rate of 300 K/minute under a stream of oxygen at a flow rate of 200 mL/minute and maintained at the temperature for 20 minutes.

The heated chemical solution was cooled to room temperature at a cooling rate of 100 K/minute.

The procedure including the spin coating and the heat treatment of the chemical solution was also repeated six times to form a single-crystal conductive thin film of Nb-doped $SrTiO_3$ on the thin film of $BaZrO_3$ formed on the MgO(100) substrate. Note that for the second and subsequent repetitions of the procedure including the spin coating and the heat treatment of the chemical solution, another single-crystal conductive thin film component of Nb-doped $SrTiO_3$ is formed on the preceding single-crystal conductive thin film component of Nb-doped $SrTiO_3$.

In this way, a sample was produced in Example 3, the sample including the single-crystal conductive thin film of Nb-doped $SrTiO_3$ on the thin film of $BaZrO_3$ arranged on the MgO(100) surface of the MgO(100) substrate.

Figure 7:
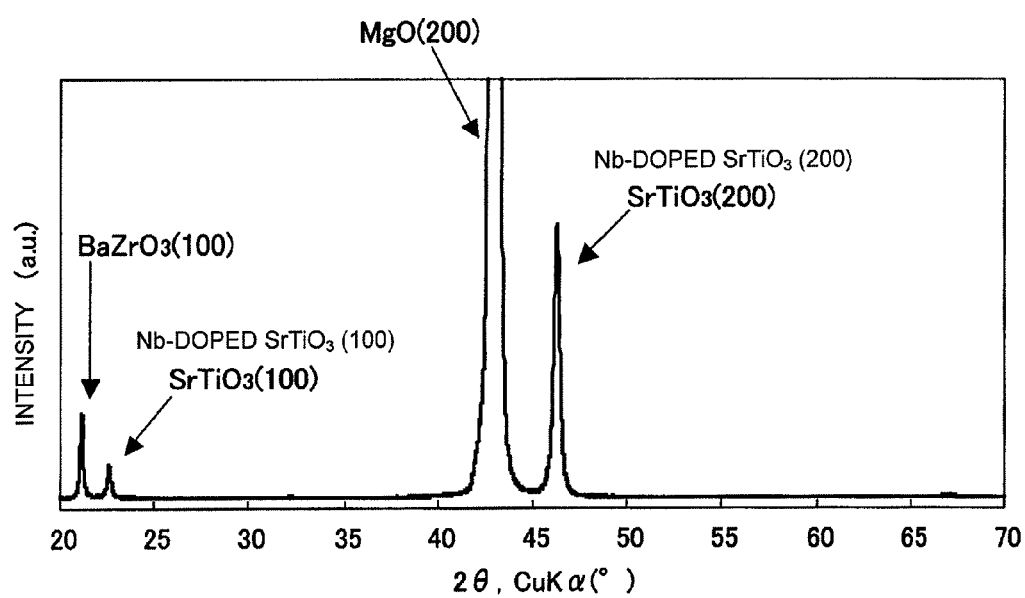
FIG. 7 is an X-ray diffraction spectrum of a sample produced in Example 3.

FIG. 7 is an X-ray diffraction spectrum of the sample produced in Example 3. In the X-ray diffraction spectrum shown in FIG. 7, the (100) and (200) peaks of $SrTiO_3$, the (100) peak of $BaZrO_3$, and the (200) peak of MgO were observed as in the sample produced in Example 2. This indicated that the resulting single-crystal thin film of $BaZrO_3$ was strongly oriented in the [100] direction and that the resulting single-crystal conductive thin film of Nb-doped $SrTiO_3$ formed thereon was also oriented in the [100] direction. In the X-ray diffraction spectrum shown in FIG. 7, the MgO(200) peak indicates that the MgO(100) substrate is oriented in the direction.

For the sample produced in Example 3, the resistance of the single-crystal conductive thin film of Nb-doped $SrTiO_3$ was measured by a four-terminal method. As a result, the single-crystal conductive thin film had a resistivity of $3 \times 10^{-3}$ Ω·cm. This indicated that the single-crystal conductive thin film of Nb-doped $SrTiO_3$ had conductivity.

For Example 3, therefore, the same advantages as in Examples 1 and 2 were provided. In particular, it is possible to produce a single-crystal conductive thin film that can be used for a switch and a contact for use in, for example, a display and a touch panel and an electrode of a sensor.

EXPERIMENTAL EXAMPLE

In the method for producing a single-crystal thin film according to preferred embodiments of the present invention, studies were conducted on a preferred ratio of Ti to Zr in a thin film of $Ba(Ti_aZr_{1-a})O_3$ formed on a MgO(100) surface of a MgO(100) substrate serving as a substrate used for single-crystal growth.

In the Experimental Example, MgO(100) substrates were prepared as substrates used for single-crystal growth.

Four chemical solutions serving as raw materials for thin films of $Ba(Ti_aZr_{1-a})O_3$ were prepared under preparation conditions described in items 1 to 4 in such a manner that the thin films had molar ratios of Ti to Zr of 0.9:0.1, 0.8:0.2, 0.7:0.3, and 0.6:0.4.

1. Preparation Conditions of Solution for $Ba(Ti_{0.9}Zr_{0.1})O_3$

| Raw material | |
| --- | --- |
| Barium acetate | 1.146 g |
| Titanium isopropoxide | 1.150 g |
| Zirconium isopropoxide | 0.145 g |
| Solvent | |
| Acetic acid | 3 mL |
| 2-Methoxyethanol | 7 mL |

2. Preparation Conditions of Solution for $Ba(Ti_{0.8}Zr_{0.2})O_3$

| Raw material | |
| --- | --- |
| Barium acetate | 1.146 g |
| Titanium isopropoxide | 1.022 g |
| Zirconium isopropoxide | 0.296 g |
| Solvent | |
| Acetic acid | 3 mL |
| 2-Methoxyethanol | 7 mL |

3. Preparation Conditions of Solution for $Ba(Ti_{0.7}Zr_{0.3})O_3$

| Raw material | |
| --- | --- |
| Barium acetate | 1.146 g |
| Titanium isopropoxide | 0.894 g |
| Zirconium isopropoxide | 0.434 g |
| Solvent | |
| Acetic acid | 3 mL |
| 2-Methoxyethanol | 7 mL |

4. Preparation Conditions of Solution for $Ba(Ti_{0.6}Zr_{0.4})O_3$

| Raw material | |
| --- | --- |
| Barium acetate | 1.146 g |
| Titanium isopropoxide | 0.725 g |
| Zirconium isopropoxide | 0.591 g |
| Solvent | |
| Acetic acid | 3 mL |
| 2-Methoxyethanol | 7 mL |

The resulting four chemical solutions serving as raw materials for thin films were applied on surfaces of the four MgO (100) substrates by spin coating in the same way as in Example 1. That is, each of the chemical solutions was placed on the MgO(100) surface of one of the MgO(100) substrates and rotated together with the MgO(100) substrate at 600 rpm for 3 seconds and then at 4000 rpm for 30 seconds so as to be in the form of a thin film. The thin-film shaped chemical solution was dried on a hot plate at 150° C. for 5 minutes.

The chemical solutions applied by spin coating were then subjected to heat treatment under conditions described below, as in Example 1.

Conditions of Heat Treatment

Each of the chemical solution applied by spin coating was heated from room temperature to 800° C. at a heating rate of 300 K/minute under a stream of oxygen at a flow rate of 200 mL/minute and maintained at the temperature for 20 minutes.

The heated chemical solution was cooled to room temperature at a cooling rate of 100 K/minute.

The procedure including the spin coating and the heat treatment of each chemical solution was also repeated six times. Thereby, four types of thin films were formed on the MgO(100) surfaces of the four MgO(100) substrates.

In this way, samples were produced in Experimental Example, each of the samples including a thin film of $Ba(Ti_{0.9}Zr_{0.1})O_3$, $Ba(Ti_{0.8}Zr_{0.2})O_3$, $Ba(Ti_{0.7}Zr_{0.3})O_3$, or $Ba(Ti_{0.6}Zr_{0.4})O_3$ formed on the MgO(100) surface of a corresponding one of the four MgO(100) substrates.

Figure 8:
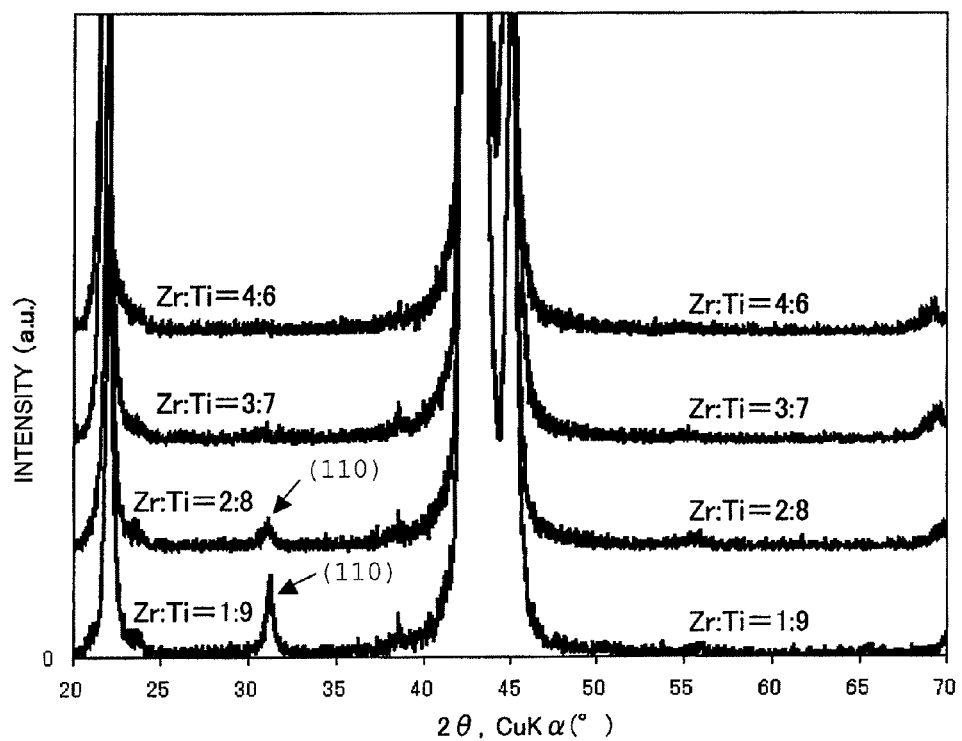
FIG. 8 is X-ray diffraction spectra of samples produced in Experimental Example.

FIG. 8 is X-ray diffraction spectra of samples produced in Experimental Example. The (110) peak was observed in the X-ray diffraction spectra shown in FIG. 8, in the case of the thin film composed of $Ba(Ti_{0.8}Zr_{0.2})O_3$ (Ti:Zr=8:2). The intensity of the peak was lower than that of the (110) peak of the thin film composed of $Ba(Ti_{0.9}Zr_{0.1})O_3$ (Ti:Zr=9:1). That is, the thin film of $Ba(Ti_{0.8}Zr_{0.2})O_3$ was more strongly affected by the MgO(100) substrate and more oriented along the [100] direction than the thin film of $Ba(Ti_{0.9}Zr_{0.3})O_3$.

The results demonstrated that with respect to a preferred ratio of Ti to Zr, the thin film composed of $Ba(Ti_aZr_{1-a})O_3$ formed on the MgO(100) surface of the MgO(100) substrate serving as a substrate used for single-crystal growth preferably had a zirconium content equal to or higher than a value such that a ratio of Ti to Zr of 8:2 was satisfied. In other words, the preferred ratio corresponds to $0 \leq a \leq 0.8$ in $Ba(Ti_aZr_{1-a})O_3$.

In the X-ray diffraction spectra shown in FIG. 8, in the case of a Zr content equal to or higher than a value such that a ratio of Ti to Zr of 7:3 was satisfied, i.e., no (110) peak was observed in the case of the thin films composed of $Ba(Ti_{0.7}Zr_{0.3})O_3$ and $Ba(Ti_{0.6}Zr_{0.4})O_3$. The results demonstrated that the films were more strongly affected by the MgO(100) substrates and more oriented along the [100] direction.

Accordingly, with respect to a preferred ratio of Ti to Zr, the thin film composed of $Ba(Ti_aZr_{1-a})O_3$ formed on the MgO (100) surface of the MgO(100) substrate serving as a substrate used for single-crystal growth preferably had a zirconium content equal to or higher than a value such that a ratio of Ti to Zr of 7:3 was satisfied. In other words, the preferred ratio corresponds to $0 \leq a \leq 0.7$ in $Ba(Ti_aZr_{1-a})O_3$.

In Examples 1, 2, and 3 and the like, the MgO(100) substrates were used as substrates for single-crystal growth. Alternatively, according to preferred embodiments of the present invention, other substrates having a MgO(100) surface may be used. Also in the case of using such a substrate, the same advantages as those of the MgO(100) substrate are provided.

According to preferred embodiments of the present invention, furthermore, a thin film composed of $Ba(Ti_aZr_{1-a})O_3$ (wherein $0 \leq a \leq 0.8$ and desirably $0 \leq a \leq 0.7$) having a lattice constant close to a lattice constant of an underlying substrate used for single-crystal growth and close to a lattice constant of an overlying single-crystal thin film is preferably used in view of the production of good single-crystal thin film.

In Examples 1, 2, and 3 and the like, furthermore, the single-crystal thin film composed of $BaTiO_3$, the single-crystal thin film composed of $SrTiO_3$, or the single-crystal thin film of Nb-doped $SrTiO_3$ was produced. According to preferred embodiments of the present invention, another single-crystal thin film composed of $(Ba_xSr_yCa_z)TiO_3$ (wherein x+y+z=1.0) such as $CaTiO_3$ may be produced.

It is known that the solid solution $(Ba_xSr_yCa_z)TiO_3$ (wherein x+y+z=1.0) is stably obtained in the absence of Ca, using a relatively small amount ($0 \leq z \leq 0.2$) of Ca, or a relatively large amount ($0.3 \leq y \leq 1.0$) of Sr. Thus, according to preferred embodiments of the present invention, a single-crystal thin film having the composition within the above range may be produced. In this case, according to preferred embodiments of the present invention, with respect to $(Ba_xSr_yCa_z)TiO_3$ (wherein x+y+z=1.0), in particular, in the case of a calcium ratio z of 0 to 0.2, a single-crystal thin film having good crystallinity can be produced compared with the case of a calcium ratio z exceeding 0.2.

According to preferred embodiments of the present invention, a metal element with which a single-crystal thin film is doped is preferably added in a trace amount such that the effect of the addition of the metal element is provided and that the lattice constant of the single-crystal thin film is not drastically changed. The metal element is preferably added in an amount of, for example, 3 to 10% by mole. In this case, the metal element may be added to $(Ba_xSr_yCa_z)TiO_3$ (wherein x+y+z=1.0). Alternatively, the metal element may substitute partially for $(Ba_xSr_yCa_z)Ti$ in $(Ba_xSr_yCa_z)TiO_3$ (wherein x+y+z=1.0). Thus, according to preferred embodiments of the present invention, a single-crystal thin film having a ratio of Ba to Ti to Nb of, for example, 1.0:0.9:0.1 may be produced as well as the single-crystal thin film having a ratio of Ba to Ti to Nb of 1.0:1.0:0.1 described in Example 3. Examples of the metal element that can be used as a dopant include Mn and Mg as well as Nb, W, Eu, and Ce.

In Examples 1, 2, and 3 and the like, the chemical solutions were heated to 800° C. However, each chemical solution may be heated to a temperature lower or higher than 800° C. If the chemical solution is heated to a temperature lower than 800° C., the chemical solution may be heated for prolonged periods of time. If the chemical solution is heated to a temperature higher than 800° C., the chemical solution may be heated for a short time. Furthermore, the heating temperature and the heating time may be changed in response to conditions of raw materials and the like.

In Examples 1, 2, and 3 and the like, barium acetate, strontium acetate, titanium isopropoxide, and other compounds were contained in the chemical solutions serving as raw materials for single-crystal thin films. According to preferred embodiments of the present invention, other alkoxides of barium, strontium, calcium, and titanium and other carboxylic acids may be contained in the chemical solutions serving as raw materials for single-crystal thin films.

Examples of the alkoxides include methoxides and ethoxides in addition to isopropoxides.

Examples of the carboxylic acids include formic acid, propionic acid, butyric acid, decanoic acid, and octylic acid (2-ethylhexanoic acid) in addition to acetic acid.

The use of these alkoxides and carboxylic acids also provides the same advantages as in Examples 1, 2, and 3.

The same is true for barium, titanium, and zirconium in the chemical solution serving as a raw material for a thin film of $Ba(Ti_aZr_{1-a})O_3$.

In Examples 1, 2, and 3 and the like, the procedure including the spin coating and the heat treatment of each chemical solution was repeated six times. According to preferred embodiments of the present invention, the procedure including the spin coating and the heat treatment may be performed only once. Alternatively, the procedure including the spin coating and the heat treatment may be performed a number of times other than six times. An increase in the number of repetitions of the procedure including the spin coating and the heat treatment increases the thickness of the thin film produced. A reduction in the number of repetitions of the procedure including the spin coating and the heat treatment reduces the thickness of the thin film produced. Thus, a change in the number of repetitions of the procedure including the spin coating and the heat treatment can adjust the thickness of the thin film produced.

The single-crystal thin film produced by the method for producing a single-crystal thin film according to preferred embodiments of the present invention can be used for, for example, a substrate for use in a sensor, a dielectric film for use in a capacitor, a switch and a contact for use in a display and a touch panel, an electrode of a sensor, and an electric field-application type of optical switch for use in a waveguide of an optical communication device.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A method for producing a single-crystal thin film composed of $(Ba_xSr_yCa_z)TiO_3$ in which $x+y+z=1.0$, comprising:
    spin coating applying a solution containing the raw material for the $(Ba_xSr_yCa_z)TiO_3$ single-crystal thin film on a thin film of $Ba(Ti_aZr_{1-a})O_3$ in which $0 \leq a \leq 0.8$ disposed on a MgO(100) surface of a substrate; and
    subjecting the applied solution to a heat treatment at a temperature at which orientation occurs, thereby epitaxially growing the $(Ba_xSr_yCa_z)TiO_3$ single-crystal.

2. The method according to claim 1, wherein the substrate is a MgO(100) substrate.

3. The method according to claim 2, wherein the $Ba(Ti_aZr_{1-a})O_3$ thin film is a single-crystal thin film oriented in the [100] direction.

4. The method according to claim 3, wherein the solution contains a pentavalent or hexavalent metal element dopant.

5. The method according to claim 4, wherein the chemical solution comprises
    an organic solvent,
    a titanium alkoxide or a titanium carboxylate, and
    at least one compound selected from the group consisting of barium alkoxide, barium carboxylate, strontium alkoxide, strontium carboxylate, calcium alkoxide and calcium carboxylate.

6. The method according to claim 5, wherein the sequence of application of the solution by spin coating and then subjecting the applied solution to the heat treatment is repeated at least once.

7. The method according to claim 6, wherein $0 \leq a \leq 0.7$.

8. The method according to claim 7, wherein $0 \leq z \leq 0.2$.

9. The method according to claim 8, wherein one of x and y is 0.

10. The method according to claim 8, wherein $0.3 \leq y \leq 1.0$.

11. The method according to claim 1, wherein the $Ba(Ti_aZr_{1-a})O_3$ thin film is a single-crystal thin film oriented in the [100] direction.

12. The method according to claim 1, wherein the solution contains a pentavalent or hexavalent metal element dopant.

13. The method according to claim 8, wherein the pentavalent or hexavalent metal element is 3 to 10 mol percent of the solution.

14. The method according to claim 1, wherein the chemical solution comprises
    an organic solvent,
    a titanium alkoxide or a titanium carboxylate, and
    at least one compound selected from the group consisting of barium alkoxide, barium carboxylate, strontium alkoxide, strontium carboxylate, calcium alkoxide and calcium carboxylate.

15. The method according to claim 1, wherein the sequence of applying the solution by spin coating and then subjecting the applied solution to the heat treatment is repeated at least once.

16. The method according to claim 1, wherein $0 \leq a \leq 0.7$.

17. The method according to claim 1, wherein z is 0, and one of x and y is 0.

18. The method according to claim 1, wherein x and y is 0.

19. The method according to claim 1, wherein $0 \leq z \leq 0.2$.

20. The method according to claim 1, wherein $0.3 \leq y \leq 1.0$.

* * * * *